United States Patent
Alpert et al.

(10) Patent No.: US 6,347,393 B1
(45) Date of Patent: Feb. 12, 2002

(54) METHOD AND APPARATUS FOR PERFORMING BUFFER INSERTION WITH ACCURATE GATE AND INTERCONNECT DELAY COMPUTATION

(75) Inventors: Charles Jay Alpert; Anirudh Devgan; Stephen Thomas Quay, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/317,553

(22) Filed: May 24, 1999

(51) Int. Cl.[7] .............................................. G06F 17/50
(52) U.S. Cl. ........................................ 716/2; 364/488
(58) Field of Search .................... 716/2, 8, 17; 364/488

(56) References Cited

U.S. PATENT DOCUMENTS 5,841,672 A  * 11/1998 Spyrou et al. .............. 364/488
6,117,182 A  *  9/2000 Alpert et al. .................. 716/8

* cited by examiner

*Primary Examiner*—David Nelms
*Assistant Examiner*—Thong Le
(74) *Attorney, Agent, or Firm*—Duke W. Yee; Casimer K. Salys

(57) ABSTRACT

An optimal buffer is chosen for insertion at a node by calculating a π-model of a downstream circuit to a child node where the π-model contains at least a capacitance value. The gate delay is computed at the node using an effective capacitance derived from the π-model and buffer characteristics of a particular buffer. The interconnect delay is then computed from sets of moments associated with each gate downstream from the node via a bottom-up incremental technique. Slack is computed using the gate delay for the child node and the interconnect delay for the child node and then the computed slack is compared to the slack of other buffers at the node. The node may be a sink or have one or two children.

22 Claims, 6 Drawing Sheets

METHOD AND APPARATUS FOR PERFORMING BUFFER INSERTION WITH ACCURATE GATE AND INTERCONNECT DELAY COMPUTATION

BACKGROUND OF THE INVENTION

1. Technical Field

The present invention relates in general to integrated circuit design methods and in particular to a design method for buffer insertion within integrated circuits. Still more particularly, the present invention relates to a method for optimizing buffer selection using downstream π-models.

2. Description of Related Art

Scaling process technology into the deep submicron regime has made interconnect performance more dominant than transistor and logic performance. With the continued scaling of process technology, resistance per unit length of the interconnect continues to increase, capacitance per unit length remains roughly constant, and transistor or logic delay continues to decrease. This trend has led to the increasing dominance of interconnect delay over logic delay. Process technology options, such as use of copper wires, can only provide temporary relief. The trend of increasing interconnect dominance is expected to continue. Timing optimization techniques, such as wiresizing, buffer insertion, and sizing have gained widespread acceptance in deep submicron design (see Cong et al. J. Cong, L. He, C.-K. Koh, and P. H. Madden, "Performance Optimization of VLSI Interconnect Layout", Integration: the *VLSI Journal*, 21, 1996, pp. 1–94. In particular, buffer insertion techniques can significantly reduce interconnect delay. To the first order, interconnect delay is proportional to the square of the length of the wire. Inserting buffers effectively divides the wire into smaller segments, which makes the interconnect delay almost linear in terms of its length, though buffer delays must now be considered. Buffers can also be used to fix slew, capacitance, and noise violations while reducing power, resulting in automated buffer insertion becoming increasingly pervasive as the ratio of device to interconnect delay continues to decrease.

Buffer insertion has been an active area of study in recent years. Closed formed solutions have been proposed by Adler and Friedman, "Repeater Design to Reduce Delay and Power in Resistive Interconnect", *IEEE Transactions on Circuits and Systems II: Analog and Digital Signal Processing*, Vol. CAS II-45, No. 5, pp. 607–616, May 1998; Alpert and Devgan, "Wire Segmenting For Improved Buffer Insertion", 34th *IEEE/ACM Design Automation Conference*, 1997, pp. 588–593; and Dhar and Franklin, "Optimum Buffer Circuits for Driving Long Uniform Lines", *IEEE Journal of Solid-State Circuits*, 26(1), 1991, pp. 32–40, all of which consider inserting buffers on a 2-pin net. Chu and Wong, "Closed Form Solution to Simultaneous Buffer Insertion/Sizing and Wire Sizing", *International Symposium on Physical Design*, 1997, pp. 192–197, proposed a closed form solution to simultaneous wiresizing and buffer insertion. The works of Culetu et al., "A Practical Repeater Insertion Method in High Speed VLSI Circuits", 35th *IEEE/ACM Design Automation Conference*, 1998, pp. 392–395, Kannan et al., "A Methodology and Algorithms for Post-Placement Delay Optimization", 31st *IEEE/ACM Design Automation Conference*, 1994, pp. 327–332; and Lin and Marek-Sadowska, "A Fast and Efficient Algorithm for Determining Fanout Trees in Large Net-works", Proc. of the *European Conference on Design Automation*, 1991, pp. 539–544, teach inserting buffers on a tree by iteratively finding the best location for a single buffer. Approaches which simultaneously construct a routing tree and insert buffers have been proposed by Kang et al., "Delay Bounded Buffered Tree Construction for Timing Driven Floorplanning", *IEEE/ACM Intl. Conf. Computer-Aided Design*, 1997, pp. 707–712; Lillis et al., "Simultaneous Routing and Buffer Insertion for High Performance Interconnect", Proc. 6th *Great Lakes Symposium on Physical Design*, 1996, pp 7–12; and Okamoto and Cong, "Interconnect Layout Optimization by Simultaneous Steiner Tree Construction and Buffer Insertion", *Fifth ACM/SIGDA Physical Design Workshop*, 1996, pp. 1–6. Chu and Wong, "A New Approach to Simultaneous Buffer Insertion and Wire Sizing", *IEEE/ ACM International Conference on Computer-Aided Design*, 1997, pp. 614–621, present an iterative optimization which simultaneously performs wiresizing and buffer insertion on a 2-pin net.

In 1990, Van Ginneken, "Buffer Placement in Distributed RC-tree Networks for Minimal Elmore Delay", *Proc. International Symposium on Circuits and Systems*, 1990, pp. 865–868, proposed a dynamic programming algorithm which finds the optimal solution using the Elmore wire delay model and a linear gate delay model. The algorithm only permits a single, non-inverting buffer type to be considered. Several extensions and variants have been proposed to this fundamental approach, Alpert and Devgan, "Wire Segmenting For Improved Buffer Insertion", 34th *IEEE/ACM Design Automation Conference*, 1997, pp. 588–593; Alpert, Devgan and Quay, "Buffer Insertion for Noise and Delay Optimization", 35th *IEEE/ACM Design Automation Conference*, 1998, pp. 362–367; Lillis, "Timing Optimization for Multi-Source Nets: Characterization and Optimal Repeater Insertion", 34th *IEEE/ACM Design Automation Conference*, 1997, pp. 214–219; Lillis et al., "Optimal Wire Sizing and Buffer Insertion for Low Power and a Generalized Delay Model", *IEEE Journal of Solid-State Circuits*, 31(3), 1996, pp. 437–447; Lillis et al., "Simultaneous Routing and Buffer Insertion for High Performance Interconnect", *Proc. 6th Great Lakes Symposium on Physical Design*, 1996, pp 7–12; and Okamoto and Cong, "Interconnect Layout Optimization by Simultaneous Steiner Tree Construction and Buffer Insertion", *Fifth ACM/SIGDA Physical Design Workshop*, 1996, pp. 1–6. Lillis et al., "Optimal Wire Sizing and Buffer Insertion for Low Power and a Generalized Delay Model", *IEEE Journal of Solid-State Circuits*, 31(3), 1996, pp. 437–447, extended Van Ginneken's algorithm to simultaneously perform wiresizing and buffer insertion with a buffer library that contains both inverting and non-inverting buffers. In addition, Lillis et al. show, in "Optimal Wire Sizing and Buffer Insertion for Low Power and a Generalized Delay Model", how to control the total number of buffers inserted and how to integrate input slew into the gate delay function. Later, Lillis showed in "Timing Optimization for Multi-Source Nets: Characterization and Optimal Repeater Insertion", how to modify Van Ginneken's algorithm to handle nets with multiple sources. Alpert and Devgan proposed in "Wire Segmenting For Improved Buffer Insertion" a wire segmenting pre-processing algorithm to handle the one-buffer-per-wire limitation of Van Ginneken's algorithm, which results in a smooth trade-off between solution quality and run time. Alpert et al. showed in "Buffer Insertion for Noise and Delay Optimization", how to simultaneously modify the algorithm to avoid coupling noise while only suffering a slight delay penalty.

All of the variants to Van Ginneken's algorithm and most other works in buffer insertion (with the exceptions of V.

Adler and E. G. Friedman, "Repeater Design to Reduce Delay and Power in Resistive Interconnect", and S. Dhar and M. A. Franklin, "Optimum Buffer Circuits for Driving Long Uniform Lines"), use both simplified gate and wire delay models. The Elmore delay model can significantly overestimate interconnect delay, as it incorporates only the first moment of the impulse response. Similarly, using lumped capacitance instead of effective capacitance can overestimate delay by ignoring resistive shielding, as described in Qian, Pullela, and Pillage, "Modeling the "Effective Capacitance" for the RC Interconnect of CMOS Gates", *IEEE Trans. Computer-Aided Design*, 13(12), 1994, pp. 1526–1535. As the driver resistance becomes comparable to the resistance of the interconnect it drives, some of the downstream capacitance becomes shielded from the gate. In effect, the driver is not driving the entire downstream lumped capacitance but rather an effective capacitance that is less than the total lumped capacitance. It has been empirically shown that using an effective capacitance with k-factor equations is within 10% of SPICE simulation.

FIG. 1 illustrates the magnitude of the errors that can be obtained from simple delay models in a simple RC network. The RC network consists of resistor R1 having a value of 0.1 kΩ between nodes N1 and N2 and resistor R2 with a value of 1.0 kΩ between nodes N2 and N3. Capacitor C1, having a value of 100ff, is displaced between node N2 and ground, while capacitor C2 having a value of 100ff, is displaced between node N3 and ground. Given an input slew of 300 ps at node N1, RICE (a reduced order interconnect analyzer) from Ratzlaff and Pillage, "RICE: Rapid Interconnect Circuit Evaluator using Asymptotic Waveform Evaluation", predicts a 10 ps delay from N1 to N2 and a 697 ps delay from N1 to N3. The corresponding Elmore delays are 110 ps and 1110 ps, respectively. Hence, the Elmore delay is wrong by more than a factor of ten for the delay from N1 to N2. Liu et al., Disclose in "Design and Implementation of a Global Router Based on a New Layout-Driven Timing Model with Three Poles", concur that Elmore delay causes over 100% overestimation error when compared to SPICE.

The total lumped capacitance seen at node N1 is 1100 ff, whereas for a step input, RICE predicts an effective capacitance of 158 ff. Since gate delays are roughly linear with respect to capacitance, using lumped instead of effective capacitance could lead to an error of a factor of seven. Therefore, previous works on buffer insertion utilize a linear delay model.

Using inaccurate delay models can hurt buffer insertion algorithms in two ways. First, since they only roughly correspond to the true delay, even optimal solutions for these inaccurate models may be inferior when considering the true delay. Second, inaccurate delay modeling can cause a poor evaluation of the trade-off between the total number of buffers and the improvement in delay. For example, one might conclude from inaccurate delay modeling that inserting one buffer reduces the delay by 2 ns, when it actually reduces the delay by only 1.5 ns. If the net's slack is −1.7 ns, then one would conclude from the inaccurate delay models that inserting a single buffer would be sufficient to meet timing constraints. However, the new slack would not be +0.3 ns, but −0.2 ns, i.e., timing constraints are still not satisfied.

SUMMARY OF THE INVENTION

The present invention discloses a new buffer insertion algorithm which improves Van Ginneken's algorithm by using both accurate interconnect and gate delay models. In one embodiment of the present invention, the improvements are general enough to apply to all of the extensions to Van Ginneken's algorithm that have been proposed previously, e.g., noise avoidance, simultaneous tree construction, handling inverting buffers, and wiresizing. For interconnect delay, the present invention computes moments via a bottom-up incremental technique; it performs moment matching to compute two poles and residues; and then it computes delay using Newton-Raphson iterations. For gate delays, the present invention stores the downstream driving point admittances, i.e., π-models, at each node in the tree, then propagates these π-models up the tree in accordance with experimental results on several nets in an industry design which demonstrate that the runtime penalties for using the improved wire and gate delay models are not prohibitive. Furthermore, using the present invention produces buffered nets with significantly better slack along the critical paths than those produced by Van Ginneken's algorithm.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 2:
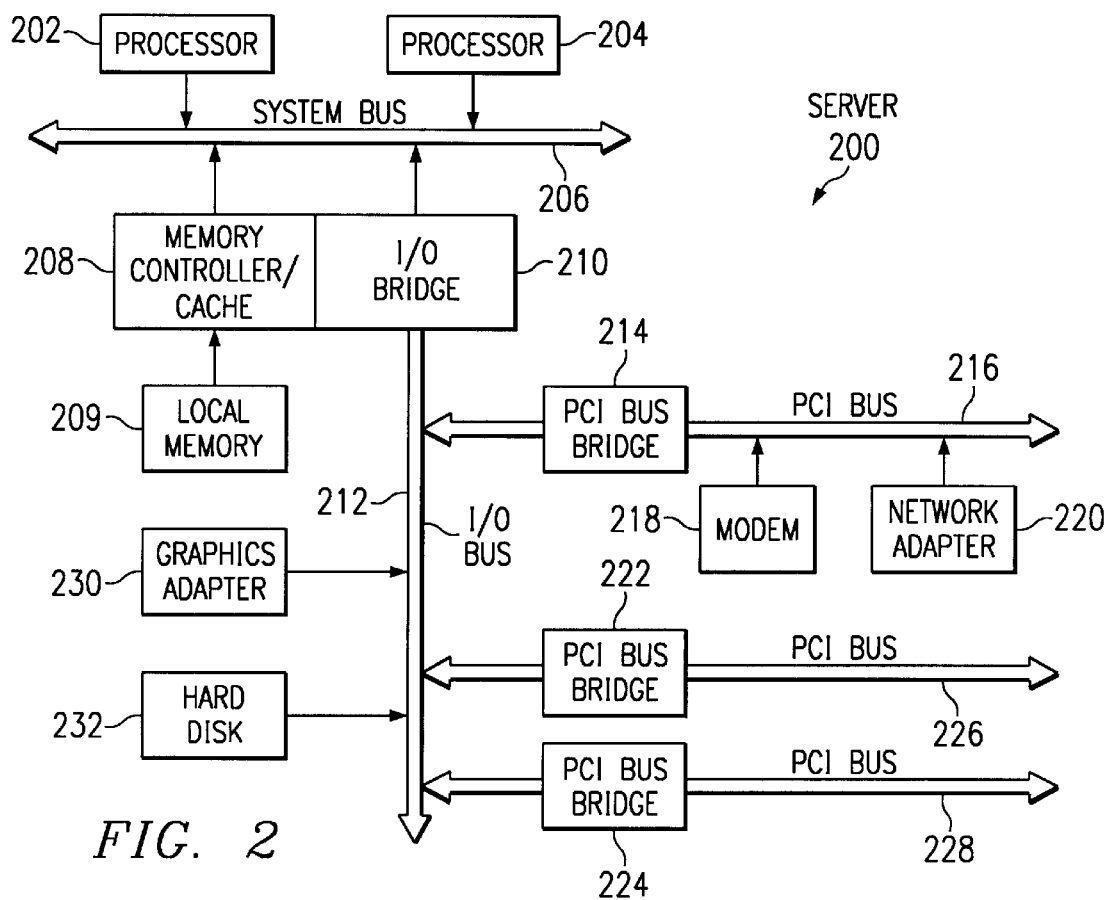
FIG. 2 is block diagram depicting a data processing system in accordance with the present invention.

With reference now to the figures, and in particular with reference to FIG. 2, a block diagram of a data processing system is depicted in accordance with the present invention. Data processing system 200 may be a symmetric multiprocessor (SMP) system including a plurality of processors 202 and 204 connected to system bus 206. Alternatively, a single processor system may be employed. Also connected to system bus 206 is memory controller/cache 208, which provides an interface to local memory 209. I/O bus bridge 210 is connected to system bus 206 and provides an interface to I/O bus 212. Memory controller/cache 208 and I/O bus bridge 210 may be integrated as depicted.

Peripheral component interconnect (PCI) bus bridge 214 connected to I/O bus 212 provides an interface to PCI local bus 216. Modem 218 and network adapter 220 may be connected to PCI bus 216. Typical PCI bus implementations support four PCI expansion slots or add-in connectors.

Additional PCI bus bridges 222 and 224 provide interfaces for additional PCI buses 226 and 228, from which additional modems or network adapters may be supported. In this manner, server 200 allows connections to multiple network computers. A memory mapped graphics adapter 230 and hard disk 232 may also be connected to I/O bus 212 as depicted, either directly or indirectly.

Those of ordinary skill in the art will appreciate that the hardware depicted in FIG. 2 may vary. For example, other peripheral devices, such as optical disk drives and the like, also may be used, in addition to or in place of the hardware depicted. The depicted example is not meant to imply architectural limitations with respect to the present invention.

The data processing system depicted in FIG. 2 may be, for example, an IBM RISC/System 6000 system, a product of International Business Machines Corporation in Armonk, N.Y., running the Advanced Interactive Executive (AIX) operating system.

Figure 3:
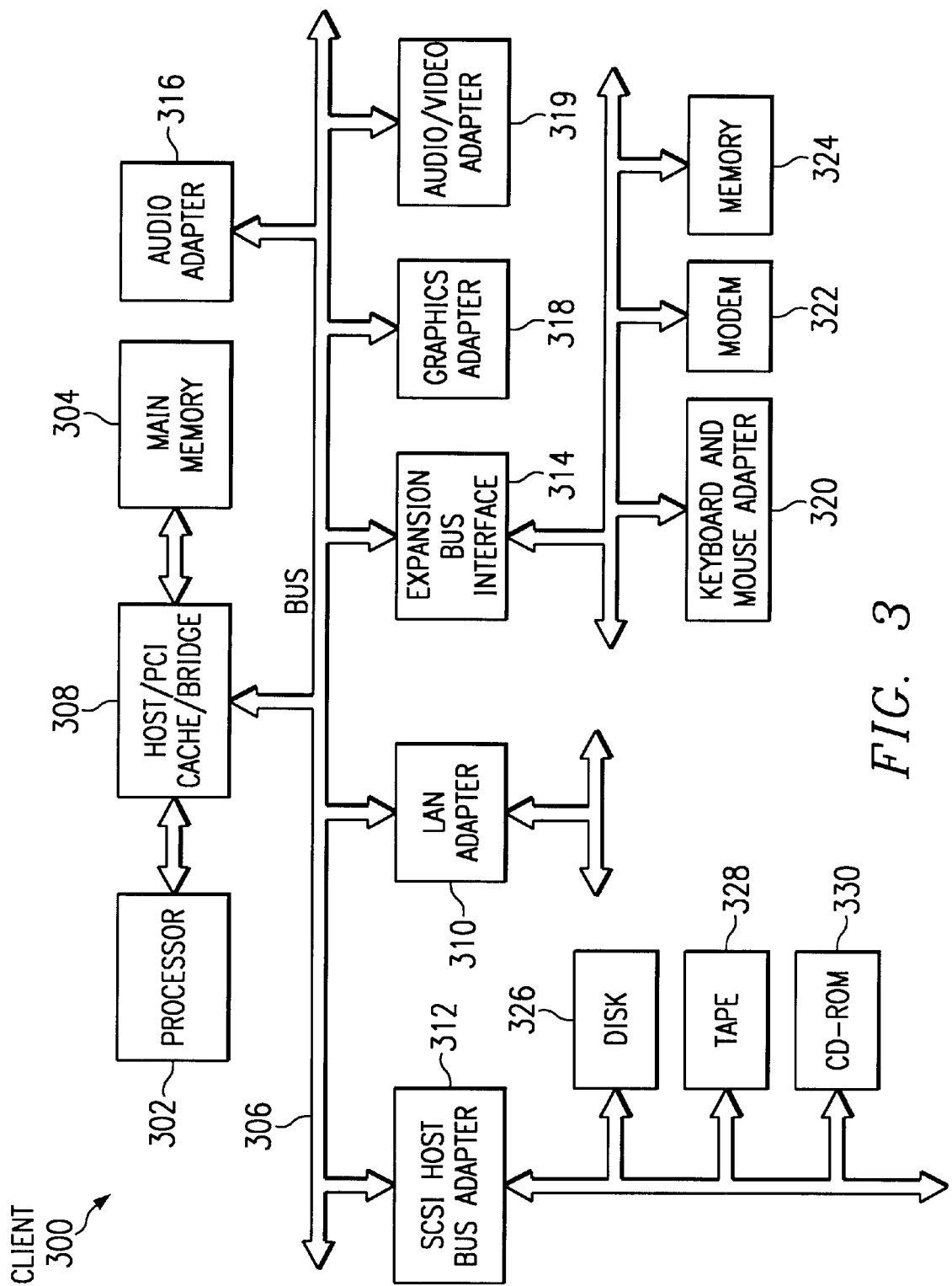
FIG. 3 is a block diagram of a data processing system in which the present invention may be implemented is illustrated.

With reference now to FIG. 3, a block diagram of a data processing system in which the present invention may be implemented is illustrated. Data processing system 300 is an example of a client computer. Data processing system 300 employs a peripheral component interconnect (PCI) local bus architecture. Although the depicted example employs a PCI bus, other bus architectures such as Micro Channel and ISA may be used. Processor 302 and main memory 304 are connected to PCI local bus 306 through PCI bridge 308. PCI bridge 308 also may include an integrated memory controller and cache memory for processor 302. Additional connections to PCI local bus 306 may be made through direct component interconnection or through add-in boards. In the depicted example, local area network (LAN) adapter 310, SCSI host bus adapter 312, and expansion bus interface 314 are connected to PCI local bus 306 by direct component connection. In contrast, audio adapter 316, graphics adapter 318, and audio/video adapter (A/V) 319 are connected to PCI local bus 306 by add-in boards inserted into expansion slots. Expansion bus interface 314 provides a connection for a keyboard and mouse adapter 320, modem 322, and additional memory 324. SCSI host bus adapter 312 provides a connection for hard disk drive 326, tape drive 328, and CD-ROM drive 330 in the depicted example. Typical PCI local bus implementations support three or four PCI expansion slots or add-in connectors.

In the present example, an operating system runs on processor 302 and is used to coordinate and provide control of various components within data processing system 300 in FIG. 3. The operating system may be a commercially available operating system, such as OS/2, which is available from International Business Machines Corporation. "OS/2" is a trademark of International Business Machines Corporation. An object oriented programming system such as Java may run in conjunction with the operating system and provides calls to the operating system from Java™ programs or applications executing on data processing system 300. Instructions for the operating system, the object-oriented operating system, and applications or programs are located on storage devices, such as hard disk drive 326, and may be loaded into main memory 304 for execution by processor 302. Application programs may include processes such as those discussed below with respect to the processes depicted in FIGS. 4, 5, 8, 12 and 13 below.

Those of ordinary skill in the art will appreciate that the hardware in FIG. 3 may vary depending on the implementation. For example, other peripheral devices, such as optical disk drives and the like, may be used in addition to or in place of the hardware depicted in FIG. 2. The depicted example is not meant to imply architectural limitations with respect to the present invention. For example, the processes of the present invention may be applied to multiprocessor data processing systems.

In stating a buffer insertion problem in accordance with the present invention, the problem assumes that the routing tree topology has already been determined via either estimation or actual routing. A routing tree $T=(V,E)$ contains a set of n−1 wires E and a set of n nodes $V=\{\{so\} \cup SI \cup IN\}$ where so is the unique source node, SI is the set of sink nodes, and IN is the set of internal nodes. A wire $e \in E$ is an ordered pair of nodes $e=(u,v)$ for which the signal propagates from u to v. The lumped capacitance and resistance for wire e are denoted by $C_e$ and $R_e$, respectively. Each node $v \in SI \cup IN$ has a unique parent wire $(u,v) \in E$. The tree is assumed to be binary, i.e., each node can have at most two children. A non-binary tree can be converted into an equivalent binary tree by inserting wires with zero resistance and capacitance where appropriate. Let the left and right children of v be denoted by T.left(v) and T.right(v), respectively. Assuming that if v has only one child, then it is T.left(v). Also given is a buffer library $\{B=b_1, b_2, \ldots, b_m\}$.

A solution to the buffer insertion problem is a mapping M: $IN \rightarrow B \cup \{\overline{b}\}$ which either assigns a buffer or no buffer, denoted by $\overline{b}$, to each internal node of T. A buffer placed on an internal node with degree d is interpreted as having one input, one output, and d−1 fanouts. Let $|M|=|\{v \in IN:M(V) \in B\}|$ denote the number of buffers inserted by the mapping. Wires may be segmented as in, "Repeater Design to Reduce Delay and Power in Resistive Interconnect", proposed by Adler and Friedman, or on the fly to create as many internal nodes as necessary to form a reasonable set of potential locations for buffer insertion. The assignment of k buffers to T induces k+1 nets and, hence k+1 subtrees, each with no internally placed buffers. For each $v \in V$, let $T(v)=(\{v\} \cup SI_{T(v)} \cup IN_{T(v)}, E_{T(v)})$, the subtree rooted at v, be the maximal subtree of T such that v is the source and T(v) contains no internal buffers. Observe that if $v \in SI$, then $T(v)=(\{v\},\emptyset)$ Assuming some model for gate and wire delays, the path from node u to v, denoted by $p(u,v)$, is an ordered subset of wires $(u,u_1), (u_1,u_2), \ldots, (u_{n-1},u_n), (u_n,v)$ of E. A wire path from node u to v, denoted by $wp(u,v)$, is a path $p(u,v)$ such that there are no buffers assigned to nodes $u_1, u_2, \ldots, u_n$, but u and v are both gates, i.e., either u=so or $M(u) \in B$ and also $v \in SI$ or $M(v) \in B$. Thus, a path with k buffers assigned to its internal nodes can be decomposed into k+1 distinct wire paths. Let Delay(v) and Delay(wp(u,v)) denote the gate delay through v (in which $M(v) \in B$ and wire delay through wp(u,v), respectively). The total delay from the source so to a sink $si \in SI$ is given by:

$$Delay(p(so, si)) = \sum_{wp(u,v) \in p(so,si)} Delay(u) + Delay(wp(u, v))$$

Equation (1)

The timing constraints for the buffer insertion problem can be obtained by first performing a timing analysis on the design. For a given net, the required arrival RAT(si) time for each sink si is the actual arrival time at si, minus the actual arrival time at so, plus the slack at si. The condition:

$$\forall si \in SI, Delay(p(so,si)) \leq RAT(si)$$

Equation (2)

must hold for the net to meet its timing requirements. The buffer insertion algorithm of the present invention seeks to satisfy timing constraints while minimizing the total number of inserted buffers.

Buffer Insertion Problem: Given a tree T=({so}∪SI∪IN, E), a buffer library B, find a solution M:IN→(B∪{b̄}) which minimizes |M|, such that Equation (2) holds.

Note that the gate delay (Delay(v)) and the wire (Delay(wp(u,v))) have not yet been defined so that the problem formulation can be as general as possible. A common alternative formulation is to minimize the delay on the most critical path, i.e., $\max_{si \in SI}(RAT(si) - Delay(p(so,si)))$. One problem with this formulation is that many more buffers may be inserted than are necessary, which can be wasteful in terms of area and power. Experience has shown, that the biggest improvement in the critical path delay occurs when inserting the first few buffers. Hence, a constraint driven formulation is more useful in practice.

A review of Van Ginneken's algorithm is presented since it forms the basis for this new approach in accordance with the present invention. Van Ginneken's algorithm does not have a mechanism to control the number of buffers inserted; however, Lillis et al. in "Optimal Wire Sizing and Buffer Insertion for Low Power and a Generalized Delay Model", presented an extension that allows the user to control the number of buffers inserted and thus addresses the problem formulation of the present invention.

The prior art teaches adopting the Elmore delay model as disclosed in "The Transient Response of Damped Linear Network with Particular Regard to Wideband Amplifiers" for interconnect delays. Let $C_v$ denote the input capacitance of each v. The total lumped capacitance $C_{T(v)}$ at node v is given by:

$$C_{T(v)} = \sum_{w \in SI_{T(v)}} C_w + \sum_{e \in E_{T(v)}} C_e$$

Equation (3)

The Elmore delay for a wire path is given by:

$$Delay(wp(u, u)) = \sum_{(e=(w,x)) \in wp(u,v)} R_e \left( \frac{C_e}{2} + C_{T(w)} \right)$$

Equation (4)

For gate delays, a variety of different models can be used, but a linear model is typical. Let $R_v$ be the intrinsic resistance and $K_v$ the intrinsic delay of a gate v. Van Ginneken (as well as Alpert and Devgan; Alpert and Devgan; Lillis, Cheng and Lin; and Okamoto and Cong) uses a linear gate delay model:

$$Delay(v) = K_v + R_v C_{T(v)}$$

Equation (5)

In an extension, Lillis et al., in "Optimal Wire Sizing and Buffer Insertion for Low Power and a Generalized Delay Model", also propose adding a term to this expression for accommodating input slew to the buffer.

Figure 1:
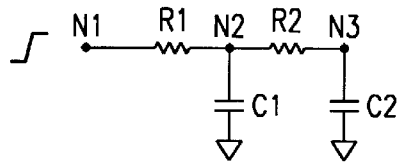
FIG. 1 illustrates the magnitude of the errors that can be obtained from simple delay models, consider simple RC network.
Figure 4:
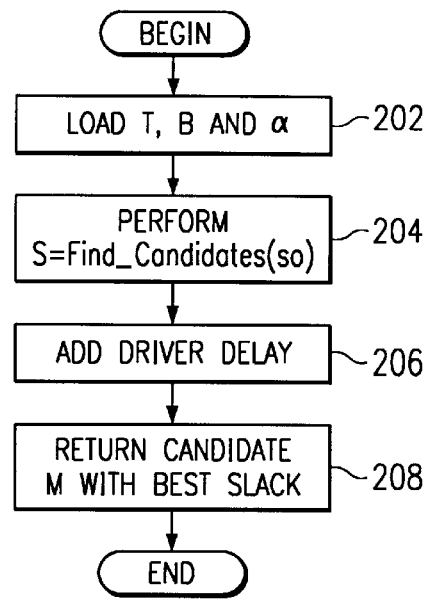
FIG. 4 depicts the high-level process of the Van Ginneken's buffer insertion algorithm, V(T,B)
Figure 5:
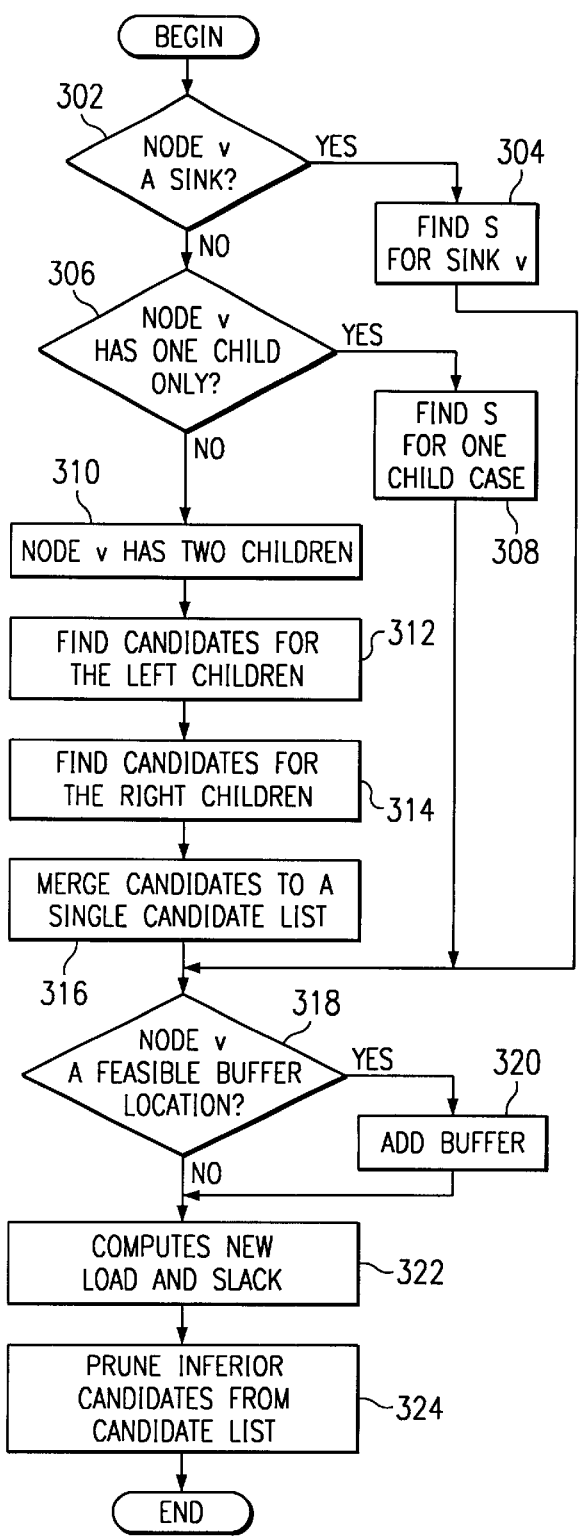
FIG. 5 shows the Find_Candidates procedure.

Van Ginneken's algorithm (VG) proceeds in bottom-up fashion starting at the sinks and ending at the source. The main idea is to store candidate solutions at each node in the tree and propagate candidates up the tree while also generating new candidates. A candidate α is defined as a 3-tuple $(C_{T(v)}, q, M)$ where $C_{T(v)}$ is the lumped capacitance seen at v, q is the slack at v, and M is the current solution for the subtree T(v). Slack is the time required for the input signal to reach node v in order to meet the required arrival times at the sinks downstream from v. When a node with two children is encountered, letting $M = M_l \cup M_r$ denote the new solution that results from merging solutions $M_l$ and $M_r$ for the left and right branches of v, i.e., M(w)=b if either $M_l(w)=b$ or $M_r(w)=b$ and M(w)=b̄ otherwise. The complete description of the algorithm is given in Table 1 and Table 2 and the process of the algorithm is illustrated in FIG. 4 and FIG. 5. Table 1 illustrated the Van Ginneken's buffer insertion algorithm, VG(T,B).

TABLE 1

| VG (T,B) |  |
| --- | --- |
| Input: | T = ({so}∪SI∪IN, E) = Routing tree |
|  | B = Buffer library |
| Output: | α = Best candidate solution for source |
| 204. | S = Find_Candidates (so) |
| 206. | for each α= ($C_{T(so)}$, q, M) ∈S do |
|  | Set q = q-$K_{so}$ -$R_{so}$ $C_{T(so)}$ |
| 208. | return M such that ($C_{T(so)}$, q, M) ∈S has maximum q |

FIG. 4 depicts the high-level process of the Van Ginneken's buffer insertion algorithm, VG(T,B). VG takes a routing tree, where T=({so}∪SI∪IN,E), and buffer library B (step 202) and returns a complete solution M. The process then calls the Find_Candidates procedure, which returns a list of candidate solutions S without incorporating driver delay (step 204). Next, driver delay is added (step 206) for each α=($C_{T(so)}$,q,M)∈S do, Set q=q-$K_{so}$-$R_{so}$ $C_{t(so)}$, where α Best candidate solution for source. The candidate M with best slack is returned in step 208, M such that ($C_{T(so)}$,q,M) ∈S has maximum q.

Table 2 shows the Find_Candidates algorithm and the procedure is depicted in FIG. 5. The Find_Candidates procedure takes node v to be processed as input, recursively computes the lists of possible candidates for all nodes in T(v), and then returns the candidate list for node v. The procedure can be broken into four main parts:

(1) Steps 302–316 examine the candidates for the children of v and merges them together to form S, the set of candidates for v. First, it is determined if node v is a sink (step 302). If that is so, step 304 handles the base case in which v is a sink. If node v is not a sink, the process moves to step 306, where it is determined if node v is a single child case. If it is so, step 308 handles the single child case. If node v is neither a sink or single child case the process flows to step 310 and assumes the two child case. The step 312 handles the left child and step 314 handles the right child in the two children case. For the two children case, the child candidate lists $S_1$ and $S_2$ are traversed, and candidates $\alpha_1$ and $\alpha_2$ are merged together by summing their downstream capacitances and taking the minimums of their slacks (step 316). Observe that the number of candidates resulting from merging the two lists is only $|S_1|+|S_r|$ as opposed to $|S_1| \cdot |S_r|$.

(2) Step 318 determines if node v is a feasible location for a buffer. If it is a feasible location, buffers are inserted for feasible candidates, thereby creating new candidates to add to S (step 320). Since it may be physically impossible to place a buffer at the current node, only nodes which are "feasible" are considered. Each buffer type b in the library is considered for insertion at v, and the candidate in S which produces the largest resulting slack from the insertion of b is added to the set of candidates.

TABLE 2

Find_Candidates (v) Procedure

| | |
|---|---|
| Input: | v = Current node to be processed |
| Output: | S = List of candidate solutions for node v |
| Globals: | T = ({so}∪SI∪IN, E) = Routing tree |
| | B = Buffer library |
| | S = $S_h$ = ∅ |
| 302. | if v∈SI then |
| 304. | S = {($C_v$, RAT (v), M)} |
| 306. | else if v has only one child then |
| 308. | for each ($C_{T(v)}$, q, M) ∈Find_Candidates (T.left(v))) do |
| | S = S∪{($C_{T(v)}$, q, M)} |
| 310. | else if v has two children |
| 312. | $S_l$ = Find_Candidates (T.left(v)) |
| 314. | $S_r$ = Find_Candidates (T.right(v)) |
| | Set i = 1 and j = 1 |
| 316. | while i≦∣$S_l$∣ and j≦∣$S_r$∣ do |
| | Let $\alpha_1$ = ($C_1,q_1,M_1$) be the $j^{th}$ candidate in list $S_l$ |
| | Let $\alpha_r$ = ($C_r,q_r,M_r$) be the $k^{th}$ candidate in list $S_r$ |
| | S = S∪{(($C_l+C_r$,min ($q_1,q_r$), ($M_1∪M_r$))} |
| | if $q_1$≦ $q_r$ then i = i +1 |
| | if $q_r$≦ $q_1$ then j = j +1 |
| 318. | if v is a feasible buffer location then |
| 320. | for each buffer b∈B do |
| | Find α= ($C_{T(v)}$, q, M) ∈S that maximizes q-$K_b$-$R_bC_b$ |
| | If such an α exists then |
| | Set M(v) = b, $S_b$ = $S_b$∪{($C_b$, q-$K_b$-$R_bC_b$, M)} |
| | S = S ∪$S_b$ |
| 322. | Let e = (u,v) be the parent wire for v |
| | for each α= ($C_{T(v)}$, q, M) ∈S do |
| | S = S ∪{($C_{T(v)}$ +$c_e$, q-$R_e$ ($C_e$/2+$C_{T(v)}$) ,M)}-α |
| 324. | Prune S of inferior solutions and return S |

(3) Step 322 computes the new load and slack (via Elmore delay) for each candidate induced by the parent wire of v.

(4) Finally, step 324 prunes inferior candidates from S. The candidates are stored in non-decreasing order by lumped capacitance, and inferior solutions are pruned in a linear pass of the current candidate list. Given two candidates $\alpha_1$=($C_1$, $q_1,M_1$) and $\alpha_2$=($C_2$, $q_2$, $M_2$) for node v, $\alpha_1$ is inferior to $\alpha_2$ if and only if $C_1>C_2$ and $q_1 \leq q_2$.

The complexity of the algorithm is $O(n^2|B|^2)$.

The linear gate delay model is inaccurate in two ways. First, if there is significant resistive shielding, the lumped capacitance will be much higher than the effective capacitance (Techniques for computing the effective capacitance are elaborate computations which are well known to those of ordinary skill in the art, thus these techniques will not be discussed in detail other than to note that Qian, Pullela, et al. disclose a useful technique in "Modeling the "Effective Capacitance"). In practice, we observe lumped capacitance to typically be 10% to 40% higher. Second, delay as a function of capacitance is complex, and a linear approximation can be highly inaccurate. Instead, it is more useful to pre-characterize each gate over a large range of loads, then perform curve-fitting to an equation with k coefficients. The resulting equations are referred to as k-factor equations. The error due to curve fitting will generally be significantly less than for a linear delay model. To compute the gate delay, we take the following three-step approach as disclosed by Qian, Pullela, et al., "Modeling the "Effective Capacitance".

1. Compute a π-model of the driving point admittance for the RC interconnect.
2. Given the π-model and the characteristics of the driver, compute an effective capacitance $C_{eff}$.
3. Use $C_{eff}$ instead of $C_{T(v)}$ when computing Delay (v) .

Also use curve-fitted k-factor equations instead of a linear model.

Figure 6A:
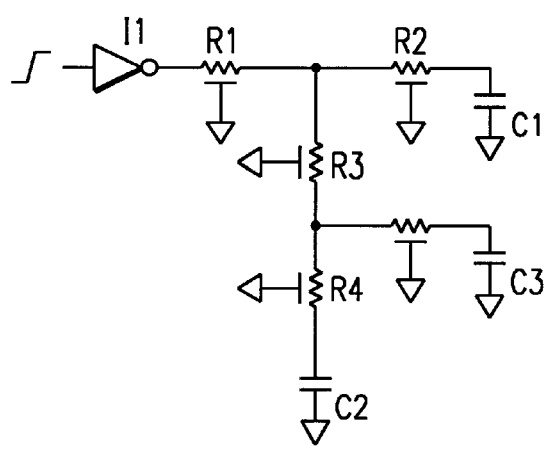
FIG. 6A shows an example of a RC network with three sinks.
Figure 6B:
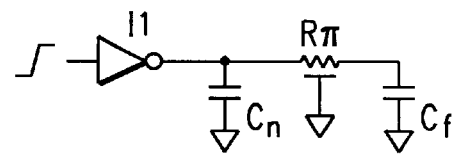
FIG. 6B shows the equivalent π-model of the network depicted in FIG. 6A.
Figure 6C:
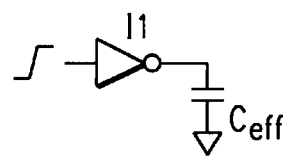
FIG. 6C illustrates the effective capacitance of the π-model.

FIG. 6A shows an example RC network with three sinks, consisting of resistors R1–R4, and capacitors C1, C2 and C3 driven by inverter I1. The network can be transformed into an equivalent π-model shown in FIG. 6B, for the driving point admittance. A π-model is a 3-tuple ($C_n$, $R_\pi$, $C_f$) where $C_n$ is the capacitance near the driver, $R_\pi$ is the resistance, and $C_f$ is the capacitance on the far side of the resistor. The effective capacitance of the π-model can then be computed as shown in FIG. 6C, again using the technique disclosed by Qian et al., "Modeling the "Effective Capacitance".

In the present enhancement of Van Ginneken's algorithm, instead storing the downstream lumped capacitance for each candidate solution, the present invention stores the π-model for the downstream RC-interconnect. If the downstream network consists of a given sink si, then the corresponding π-model is simply ($C_{si}$,0,0) . To propagate π-models up the tree, the present invention must handle two cases shown in FIGS. 7A–7D.

Figure 7A:
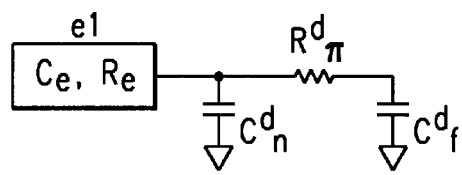
FIGS. 7A and 7B illustrate case 1 and case 2, respectively, of the downstream π-model.
Figure 7B:
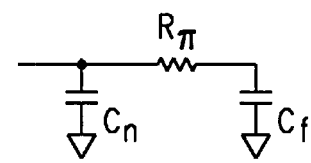

Case 1, depicted by FIGS. 7A and 7B, shows wire e1 with a downstream π-model $\pi^d$=($C_n^d$,$R_\pi^d$,$C_f^d$) represented by resistor $R_\pi^d$, near capacitor $C_n^d$ and far capacitor $C_f^d$. Wire e1 is modeled as a uniformly distributed RC line. Note that a uniform model implies that the same π-model will be computed regardless of whether or not wires have been segmented into smaller wires. Computing the new π-model $\pi$=($C_n$, $R_\pi$, $C_f$) resulting from merging $\pi^d$ with wire e1 is performed by applying the New_π-model procedure shown in Table 3.

Figure 8:
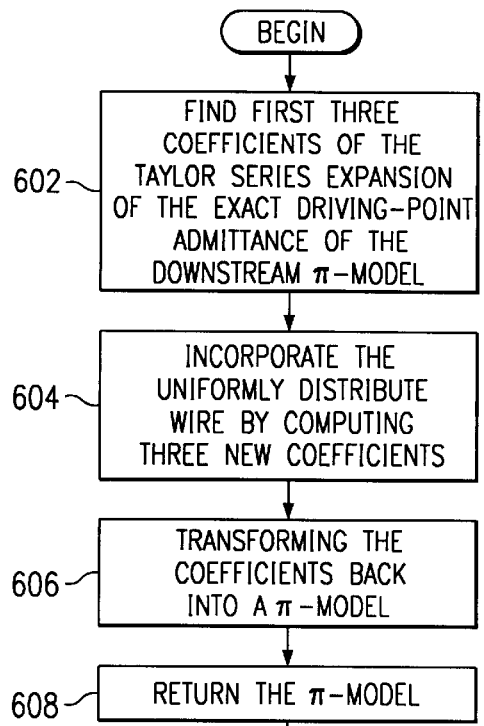
FIG. 8 illustrates a high-level block diagram of the New_π-model procedure.

FIG. 8 illustrates a high-level flow chart of the New_π-model procedure depicted in Table 3. Initially, the first three coefficients ($y_1^d$, $y_2^d$, $y_3^d$) of the Taylor series expansion are computed for the exact driving-point admittance of the downstream π-model (step 602). Next, three new coefficients ($y_1,y_2,y_3$) are computed, which incorporate the uniformly distributed wire (step 604). Finally, the inverse of step 602 is performed, by transforming the coefficients back into a π-model (step 606) which is returned in step 608. The New_π-model procedure has O(1) time complexity.

Figure 7C:
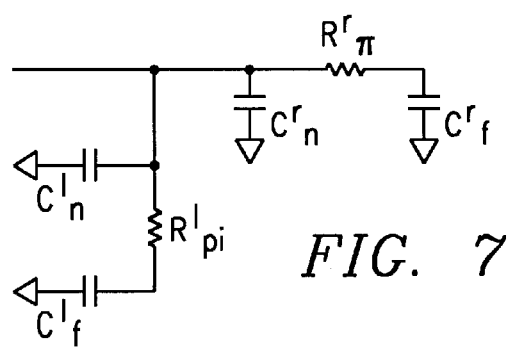
Figure 7D:
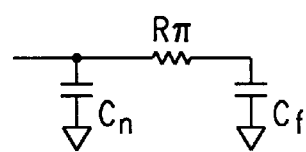

Case 2, depicted as FIGS. 7C and 7D, shows the transformation of left and right π-models $\pi^l$=($C_n^l$,$R_\pi^l$,$C_f^l$) and $\pi^r$=($C_n^r$,$R_\pi^r$,$C_f^r$) into a single π-model $\pi$=($C_n,R_\pi,C_f$) with equivalent driving point admittance. A second New_π-model procedure for Case 2 is shown in Table 4.

Figure 9:
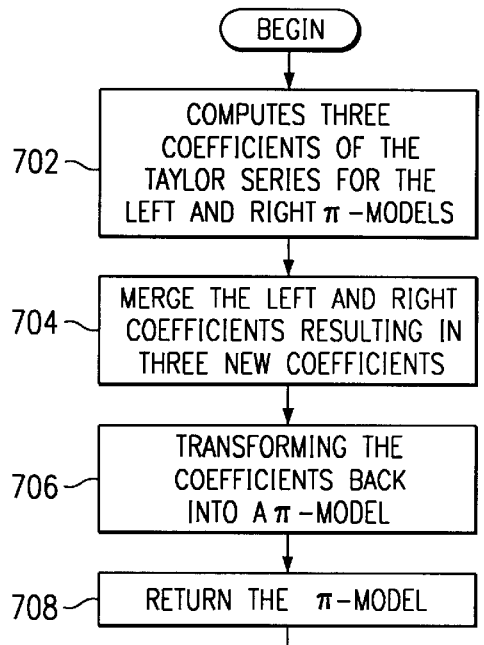
FIG. 9 illustrates a high-level block diagram of the transformation from left and right π-models to a single π-model procedure.

FIG. 9 illustrates a high-level flow chart of the transformation from left and right π-models to a single π-model procedure, depicted in Table 4. This procedure takes two π-models as input and returns a single equivalent, the π-model, which is accomplished by adding the coefficients of their Taylor series expansion of the exact driving-point admittance. The process begins by computing the coefficients ($y_1^l,y_2^l,y_3^l$) and ($y_1^r,y_2^r,y_3^r$) for the left and right π-models (step 702). The coefficients are next added together to get three new coefficients ($y_1,y_2,y_3$), which correspond to the merged π-model (step 704). The new coefficients are then transformed into the resulting π-model (step 706), which is then returned (step 708). The time complexity of this procedure is also O(1).

TABLE 3

New_$\pi$-model (e, $\pi^d$) Procedure

| | |
|---|---|
| Input: | e ≡ Wire with capacitance $C_e$, resistance $R_e$ |
| | $\pi^d = (C_n^d, R_\pi^d, C_f^d)$ = Downstream $\pi$-model |
| Output: | $\pi = (C_n, R_\pi, C_f)$ = Resulting-model |
| 602. | $y_1^d = C_n^d + C_f^d$ |
| | $y_2^d = -R_\pi^d (C_f^d)^2$ |
| | $y_3^d = (R_\pi^d)^2 (C_f^d)^3$ |
| 604. | $y_1 = y_1^d + C_e$ |
| | $y_2 = y_2^d - R_e[(y_1^d)^2 + C_e y_1^d + (C_e/3)]$ |
| | $y_3 = y_3^d - R_e[2 y_1^d y_2^d + C_e y_2^d] + R_e^2\left[\left(y_1^d + \frac{4}{3}C_e(y_1^d)^2 + \frac{2}{3}C_e^2 y_1^d + \frac{2}{15}C_e^3\right)\right]$ |
| 606. | $C_f = y_2^2 / y_3$ |
| | $C_n = y_1 - (y_2^2 / y_3)$ |
| | $R_\pi = -y_3^2 / y_2^3$ |
| 608. | Return $\pi = (C_n, R_\pi, C_f)$ |

Using the New_$\pi$-model procedure is shown in Table 3 for case 1 and Table 4 for case 2, it is possible to propagate $\pi$-models up any tree topology by iteratively applying whichever of the New_$\pi$-model procedures is appropriate. Observe that for any node v with corresponding $\pi$-model $\pi=(C_n, R_\pi, C_f)$, there is always a $C_{T(v)} = C_n + C_f$, i.e., the total lumped capacitance is preserved in the $\pi$-model but $R_\pi$ can now be used to illustrate the magnitude of resistive shielding.

TABLE 4

New_$\pi$-model ($\pi^l$, $\pi^r$) Procedure

| | |
|---|---|
| Input: | $\pi^l = (C_n^l, R_\pi^l, C_f^l)$ =$\pi$-model for the left branch |
| | $\pi^r = (C_n^r, R_\pi^r, C_f^r)$ =$\pi$-model for the right branch |
| Output: | $\pi = (C_n, R_\pi, C_f)$ =Resulting $\pi$-model |
| 702. | $y_1^l = C_n^l + C_f^l$, $y_1^r = C_n^r + C_f^r$ |
| | $y_2^l = -R_\pi^l (C_f^l)^2$, $y_2^r = -R_\pi^r (C_f^r)^2$ |
| | $y_3^l = (R_\pi^l)^2 (C_f^l)^3$, $y_3^r = (R_\pi^r)^2 (C_f^r)^3$ |
| 704. | $y_1 = y_1^l + y_1^r$, $y_2 = y_2^l + y_2^r$, $y_3 = y_3^l + y_3^r$ |
| 706. | $C_f = y_2^2 / y_3$ |
| | $C_n = y_1 - (y_2^2 / y_3)$ |
| | $R_\pi = -y_3^2 / y_2^3$ |
| 708. | Return $\pi = (C_n, R_\pi, C_f)$ |

Given a $\pi$-model and the characteristics of the gate which it drives, the effective capacitance can be computed by using well know methods such as disclosed by Qian et al. In a preferred embodiment of the preset invention, subroutines within the IBM static timing analyzer (EinsTimer) are used to compute effective capacitance. Given the effective capacitance $C_{eff}$, the linear gate delay may now be computed as $K_v + R_v C_{eff}$. However, the present invention uses empirically derived k-factor equations $(k_1 + k_2 C_{eff})t_1 + k_3 C_{eff}^3 + k_4 C_{eff} + k_5$, where $t_1$ is the input slew to the driver. If the first three terms of this the k-factor delay model are omitted, the linear model results. The same set of equations are also used, albeit with different numerical values for coefficients, to compute the slew at the output of the driver.

A preferred embodiment of the present invention discloses to accurately compute the delay for a wire path wp(u,v) as opposed to using the simple Elmore delay model (Equation (4)). Let k be the number of moments to be used in the computation.

Figure 10A:
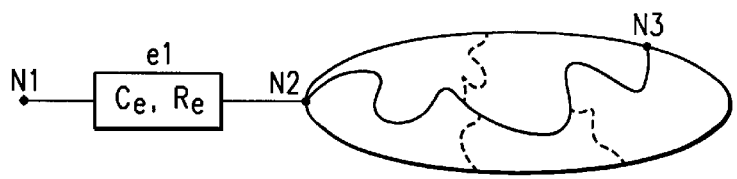
FIG. 10A shows wire e1 connected to a subtree rooted at N2.

Van Ginneken's algorithm is bottom-up, which implies that bottom-up moment computations are needed to utilize the Van Ginneken paradigm. FIG. 10A shows wire e1 connected to a subtree rooted at N2. Assume that the moments $m_{BC}^{(1)}, m_{BC}^{(2)}, \ldots, m_{BC}^{(k)}$ (subscript A referring to node N1, B to node have already been computed for the path from N2 to N3. New moments $m_{AC}^{(1)}, m_{AC}^{(2)}, \ldots, m_{AC}^{(k)}$ must be computed so that the delay from N1 to N3 can be computed. To do this efficiently, moment multiplication is performed. The ability to compute moments in this manner follows that the fact that the normalized transfer function H(s) for the path from N1 to N3 is equal to the product of the transfer functions for the paths from N1 to N2 and from N2 to N3.

Figure 10B:
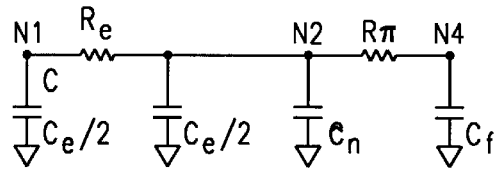
FIG. 10B depicts reducing the entire subtree rooted at N2 using the New_π-model algorithms.
Figure 10C:
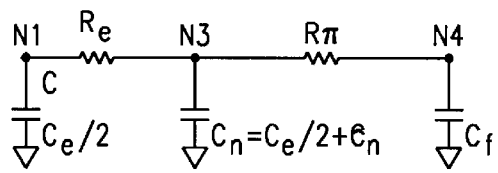

Using the New_$\pi$-model algorithms shown in Table 3 for Case 1 and Table 4 for Case 2, the entire subtree rooted at N2 can be reduced to the $\pi$-model $(\hat{C}_n, R_\pi, C_f)$ as shown in FIG. 10B. Further, wire e1 can also represented as a $\pi$-model, $(C_e/2, R_e, C_e/2)$, as depicted in FIG. 10B. Here, node N4 just represents the point on the far side of the resistor connected to node N2 and not an actual physical location. The RC network in FIG. 10B can then be simplified to the RC network shown in FIG. 10C. The two capacitances $\hat{C}_n$ and $C_e/2$ at node N2 are merged to form a single capacitor with value $C_n$. The moments from node N1 to node N2 can be recursively computed by the equation:

$$m_{AB}^{(i)} = -R_e(m_{AB}^{(i-1)} C_n + m_{AD}^{(i-1)} C_f) \qquad \text{Equation (6)}$$

where the moments from node N1 to node N4 are given by:

$$m_{AD}^{(i)} = m_{AB}^{(i)} - m_{AD}^{(i-1)} R\pi C_f \qquad \text{Equation (7)}$$

and $m_{AB}^{(0)} = m_{AD}^{(0)} = 1$. The moments from node N1 to node N4 are not needed directly (since node N1 is a fictitious node), but they are needed to compute the moments from node N1 to node N2.

Now the moments from node N1 to node N3 can be computed via moment multiplication as follows:

$$m_{AC}^{(i)} = \sum_{J=0}^{1} (m_{AB}^{(j)} \cdot m_{BC}^{(i-j)}) \qquad \text{Equation (8)}$$

The first three moments of the impulse response can be used to predict delay in an RC interconnect tree with reasonable accuracy, so an implementation of a preferred embodiment of the present invention uses k=3. Given the first three moments for a path, the following method is used to map them to a two-pole approximation. Let $m_1$, $m_2$ and $m_3$ be shorthand for the first three moments $m_{AC}^{(1)}$, $m_{AC}^{(2)}$, and $m_{AC}^{(3)}$, respectively. For a second order Padé approximation, the poles $p_1$ and $p_2$ are obtained by finding the roots to the polynomial $D(s) = 1 + d_1 s + D_2 s^2$, where:

$$d_2 = \frac{m_1 m_3 - m_2^2}{m_2 - m_1^2} \quad \text{and} \quad d_1 = \frac{m_3 - m_1 m_2}{m_1^2 - m_2} \qquad \text{Equation (9)}$$

If both $p_1$ and $p_2$ are negative, then stability is assured; however, if either pole is non-negative, the following is used instead:

$$p_1 = \frac{m_2}{m_3} \quad \text{and} \quad p_2 = p_1 \left| \frac{m_3(m_2 - m_1)}{m_1(m_1 m_3 - m_2^2)} \right| \qquad \text{Equation (10)}$$

The residues can be computed from the poles via $$k_1 = \frac{p_1^2(1 + m_1 p_2)}{p_1 - p_2} \quad \text{and} \quad k_2 = \frac{p_2^2(1 + m_1 p_1)}{p_1 - p_2} \qquad \text{Equation (11)}$$

The path delay can now be computed via a Newton-Raphson iteration, with or without a saturated ramp transition time. Convergence generally occurs within a few iterations.

One property of the Elmore delay model that makes it attractive for timing optimization is that the delays are additive, i.e., the Elmore delay along a path from node N1 to node N3 through node N2 is equal to the Elmore delay from node N1 to node N2 plus the Elmore delay from node N2 to node N3. Unfortunately, this property does not hold for more accurate delay models, which makes a bottom-up approach to buffer insertion more difficult. For example, consider the two-sink RC network shown in FIG. 11.

Figure 11:
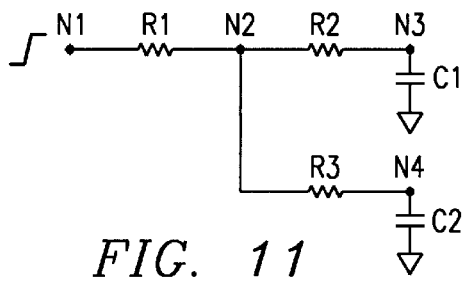
FIG. 11 illustrates a two-sink network having a resistance.

FIG. 11 illustrates a two sink network having a resistor, R1, which is an unknown resistance value located between nodes N1 and N2, 0.5 kΩ resistance R2, located between nodes N2 and N3, and resistance R3 of 1.0 kΩ between nodes N2 And N4, also having two sinks, capacitance C1 of 500 ff at sink N3 and at sink N4, capacatance C2 of 500 ff. The required arrival times at sinks N3 and N4 are 500 and 740 ps, respectively. The Elmore delays from node N2 to sink N3 and from node N2 to sink N4 are 250 and 500 ps, respectively. Hence, under the Elmore delay model, the slack at node N2 is min(500–250, 740–500)=240, and sink N4 is the more critical sink. Observe that the critical path can be deduced without knowing anything about the topology upstream from node N2, i.e., sink N4, is the critical sink regardless of the value of the resistance Ri between nodes N1 and N2.

If moment matching is used to compute higher-order delays, then one cannot deduce whether node N3 or sink N4 is the critical sink without first knowing the value of R1. Assuming a step response at node N1, if R1=0.25, then RICE reports that the higher-order delays from node N1 to sink N3 and node N1 to sink N4 are 317 and 547 ps, respectively. The slack at node N1 is thus min(500–317, 740–547)=183, and sink N3 is the most critical sink. However, if R1=1.0, then the higher-order delays from node N1 to sink N3 and from node N1 to sink N4 are 801 and 1090 ps, respectively. The slack at node N1 becomes min (500–801, 740–1090)=−350, and sink N4 is now the more critical sink. Thus, different scenarios for the upstream resistance can lead to different critical sinks, a situation which cannot occur under the Elmore delay model. Interestingly, for the case when R1=0.25, the higher-order delay from node N1 to node N2 is 24 ps, which implies that the higher-order delay from node N2 to sink N3 is 317–24= 293 ps. However, the Elmore delay from node N2 to sink N3 is 250 ps, which implies that the Elmore delay is not actually an upper bound for a given wire (or series of wires). Rather, it is an upper bound for the delay for an entire wire path.

At a particular node N2, the moments for the most critical path downstream from node N2 cannot be maintained because the most critical path is not known. Instead, one must store the moments for all the paths to sinks that are downstream from node N3 so that the delay to each sink can be computed and the critical path deduced. In a tree with n nodes and p sinks, the total number of moments that would have to be stored at internal nodes in the tree is O(np) (since no node can have downstream paths to more than p sinks). The runtime penalty for this extra computation is not prohibitive.

In accordance with a preferred embodiment of the present invention, a new algorithm $VGMC_{\mathit{eff}}$ (VG plus Moment matching plus effective capacitance) is defined. This new algorithm incorporates accurate gate and interconnect delay computations into Van Ginneken's algorithm. Recall that a candidate α was defined as a 3-tuple $(C_{T(v)},q,M)$. In the new algorithm, a candidate is now a 4-tuple $(\pi_{T(v)},q,m,M)$. Here, $\pi_{T(v)}$, replaces $C_{T(v)}$ as the model for downstream capacitance, and m is the set of the first three moments for every gate in $SI_{T(v)}$. Recall that $SI_{T(v)}$ denotes the set of gates directly downstream from v.

Table 5 and Table 6 show the description of the $VGMC_{\mathit{eff}}$ algorithm and its corresponding Find__$VGMC_{\mathit{eff}}$Cands procedure. The differences between this algorithm and Van Ginneken's original algorithm (Table 1 and Table 2) are discussed below.

TABLE 5

| $VGMC_{\mathit{eff}}$ (T, B) Algorithm | |
|---|---|
| Input: | T = ({so}∪SI∪IN, E) = Routing tree |
|  | B = Buffer library |
| Output: | α = Best candidate solution for source so |
| 1004. | S = Find__$VGMC_{\mathit{eff}}$Cands (so) |
| 1006. | for each α=($\pi_{T(v)}$, q, m, M)∈ S do |
|  | Compute $C_{\mathit{eff}}$ at so with downstream π-model $\pi_{T(so)}$ |
|  | Compute slack $q_w$ to each w∈ $SI_{T(so)}$ using moments m and Delay (so) |
|  | Let $\tilde{q}$ = min{$q_w$‖w∈ $SI_{T(v)}$} |
|  | Set q = q− Delay (so) using k-factor equations and $C_{\mathit{eff}}$ capacitance |
| 1008. | return M such that ($C_{T(so)}$, $\tilde{q}$, m, M) ∈ S has maximum $\tilde{q}$ |

Figure 12:
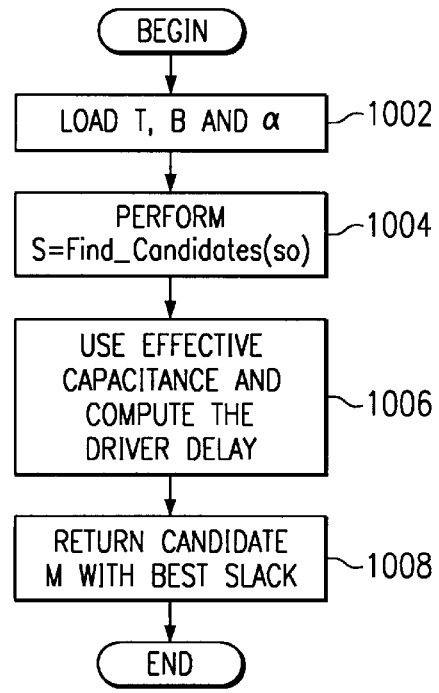
FIG. 12 is a high-level block diagram depicting the $VGMC_{eff}$ process.

FIG. 12 is a high-level flow chart depicting the $VGMC_{\mathit{eff}}$ process. $VGMC_{\mathit{eff}}$ takes a routing tree, where T=({so}∪SI∪IN,E), and buffer library B (step 1002)and returns a complete solution M. The process then calls the Find__$VGMC_{\mathit{eff}}$ Cands(so) procedure, which returns a list of candidate solutions S without incorporating driver delay (step 1004). Next, effective capacitance $C_{\mathit{eff}}$ is used to compute the driver delay at so using the downstream π-model $\pi_{T(v)}$, and moment matching is used for the interconnect delay. Slack $q_w$ is computed to each w∈ $SI_{T(v)}$ using moments m and Delay(so) (step 1006),for each best candidate where α=($\pi_{T(v)}$,q,m,M)∈S. The candidate M with maximum slack is returned in (step 1008), M such that ($C_{T(v)}$, $\tilde{q}$,m,M)∈S has maximum $\tilde{q}$.

In the main algorithm (Table 5), the differences are that effective capacitance is used to compute the driver delay, and moment matching is used for the interconnect delay. The moments have already been computed by the Find__ $VGMC_{\mathit{eff}}$ Cands procedure.

Now referring to Table 6, in steps 1102 and 1120, a π-model is constructed to represent a single capacitance value (corresponding to either a sink or an inserted buffer). For these two cases, $C_n$ is set to be the input capacitance of the gate, and both $R_\pi$ and $C_f$ are set to zero. In steps 1116 and 1122, the New__π-model procedures discussed above are invoked to compute the π-models resulting from either merging two π-models together or adding a uniform wire. These procedures replace the summing lumped capacitances in Table 2.

In order to compute interconnect delays, every candidate solution for a node v also stores the first three moments to every gate downstream from v. Each moment is initialized to zero when no interconnect is present (steps 1102 and 1120). To update the set of moments when two branches merge (step 1116), the union of the set of moments for both the left and right subtrees is constructed. When taking into account interconnect delay (step 1122), equations (6), (7), and (8) are used to compute the new set of moments $\tilde{m}$.

Figure 13:
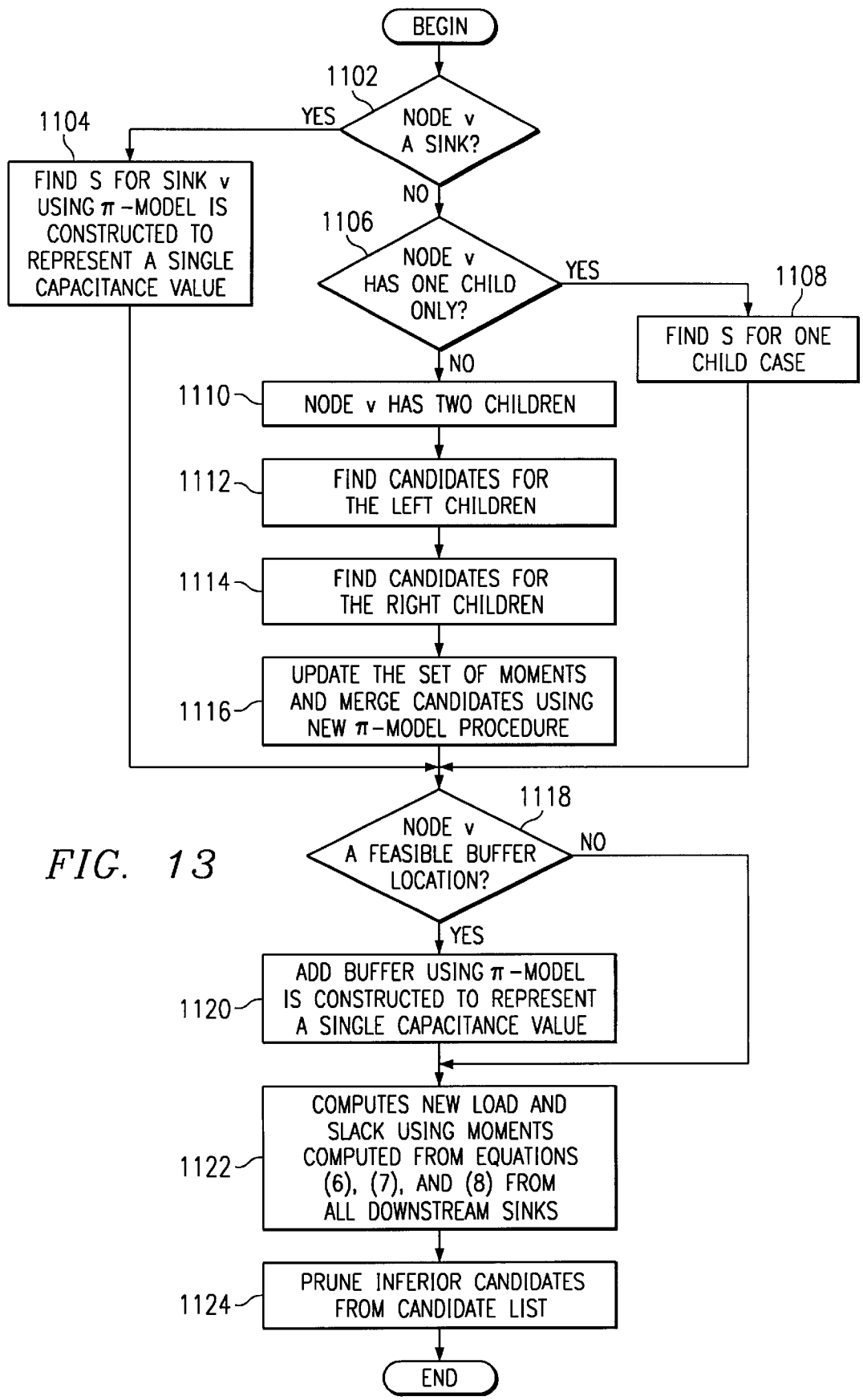
FIG. 13 depicts the high-level Find_$VGMC_{eff}$Cands process in accordance with a preferred embodiment of the present invention.

Briefly, the high-level Find__$VGMC_{\mathit{eff}}$Cands process is depicted in FIG. 13 and flows as follows. Steps 1102–1116 examine the candidates for the children of v and merges them together to form S, the set of candidates for v. First, it is determined if node v is a sink (step 1102). If node v is a sink, step 1104 handles the base case in which v is a sink using a π-model which is constructed to represent a single capacitance value. If node v is not a sink, the process moves to step 1106 where it is determined if node v is a single child case. If so, step 1108 handles the single child case. If node v is neither a sink nor a single child case, the process flows to step 1110 and assumes the two children case. Step 1112 handles the left child and step 1114 the right child of the two children case. For the two children case, the child candidate lists $S_1$ and $S_2$ are traversed, the set of moments are updated, and candidates $\alpha_1$ and $\alpha_2$ are merged using the New $\pi$-model procedure (step 1116).

At step 1118 it is determined if node v is a feasible location for a buffer. If node v is a feasible location, buffers b are inserted for feasible candidates' and $C_{eff}$ is calculated from the inserted buffer b and using the $\pi$-model downstream from v, $\pi_{T(v)}$. The delay Delay(b) from the buffer insertion, is calculated using $C_{eff}$ and k equations ($k_1+k_2C_{eff}$) $t_1+k_3C_{eff}^3+k_4 C_{eff}+k_5$. If node v is a feasible location, buffers are inserted for feasible candidates using a $\pi$-model which is constructed to represent a single capacitance value, thereby creating new candidates to add to S (step 1120). Next, compute new slack and moments while taking into account interconnect delay, using Equations (6), (7), and (8) for computing the new set of moments m (step 1122). Finally, prune inferior candidates from S (step 1124).

TABLE 6

Find_VGMC$_{eff}$Cands (v) Procedure

| | |
|---|---|
| Input: | v =Current node to be processed |
| Output: | S =List of candidate solutions for node v |
| Globals: | T =({so}USIUIN, E) =Routing tree |
| | B=Buffer library |
| | S = S$_h$ =Ø |
| 1102. | if v∈SI then |
| 1104. | S = {($\pi$=(C$_v$, O, O), RAT (v), m={{O,O,O}}, M)} |
| 1106. | else if v has only one child then |
| 1108. | for each ($\pi_{T(v)}$, q, m, M) ∈Find_VGMC$_{eff}$Cands (T.left (v)) do |
| | S = SU{($\pi_{T(v)}$, q, m, M)} |
| 1110. | else if v has two children |
| 1112. | S$_1$ = Find_VGMC$_{eff}$Cands (T.left(v)) |
| 1114. | S$_r$ = Find_VGMC$_{eff}$Cands (T.right(v)) |
| | Set I = 1 and j = 1 |
| 1116. | while I ≤ \|S$_1$\| and j ≤ \|S$_r$\| do |
| | Let $\alpha_1$ =($\pi_1$,q$_1$, m$_1$, M$_1$) be the j$^{th}$ candidate in list S$_1$ |
| | Let $\alpha_1$ =($\pi_r$,q$_r$, m$_r$, M$_r$) be the k$^{th}$ candidate in list S$_r$ |
| | S = SU{(New_$\pi$-model ($\pi_1$, $\pi_r$), min (q$_1$, q$_r$), m$_1$Um$_r$, M$_1$UM$_r$)} |
| | if q$_1$ ≤ q$_r$ then i = i + 1 |
| | if q$_r$ ≤ q$_1$ then j = j + 1 |
| 1118. | if v is a feasible buffer location then |
| 1120. | for each buffer b ∈ B do |
| | for each $\alpha$=($\pi_{T(v)}$, q, m, M) ∈ S |
| | Compute C$_{eff}$ from b and $\pi_{T(v)}$ |
| | Use C$_{eff}$ and k-factor equations to compute Delay (b) |
| | Compute slack q$_w$ to each W∈SI$_1$ (v) |
| | using moments m and Delay (b) |
| | Let q̄= min{q$_w$\|w∈SI$_{T(v)}$} |
| | Let $\alpha$ be such that q̄ is maximum |
| | if such an $\alpha$ exists then |
| | Set M(v)= b, S$_b$ = S$_b$ ∪{($\pi$=(C$_b$, O, O), q̄, m={{O, O, O}}, M)} |
| | S = SUS$_b$ |
| 1122. | Let e = (u, v) be the parent wire for |
| | for each $\alpha$=($\pi$T$_{(v)}$, q̄, m, M) ∈S do |
| | Compute moments m from u to each w∈SI$_{T(v)}$ using m, e, and Equations (6), (7), and (8) |
| | Compute slack q$_w$ to each w∈SI$_{T(v)}$ using moments m̃ |
| | S = SU{(New_$\pi$-model (e, $\pi$, r),min{q$_w$\|w∈SI$_{T(v)}$}, m̃, M)}-$\alpha$ |
| 1124. | Prune S of inferior solutions and return S |

Slack is now updated differently when a buffer is added to the current candidate. In step 1120, instead of subtracting the linear gate delay from the current slack, the slack to all sinks downstream from v is recomputed. First, the effective capacitance for the gate is computed from the $\pi$-model. Then the delay and the output slew of the buffer are computed via k-factor equations. We use an input slew of 400 ps to the buffer. The output slew of the buffer is as the input transition time to the Newton-Raphson iteration for computing the interconnect delay (and slack) to all sinks. Finally, the minimum slack $\bar{q}$ over all sinks downstream is computed. Updating slack due to interconnect is similar (step 1122).

The use of a fixed, 400 ps input slew when computing the buffer delay was made arbitrarily. In general, when inserting a buffer, the topology of the tree upstream from the buffer is still unknown. Hence, it is impossible to know what the input slew will be for the buffer, therefore, for simplicity a fixed slew so for simplicity. Tight user slew constraints on the buffers would help in that the slew constraint would give a suitable upper bound for the real slew that eventually would be seen at the buffer's input pin.

One step that did not change in VGMC$_{eff}$ is the solution pruning scheme, step 1124. In both VGMC$_{eff}$ and VG, pruning is based on total lumped capacitance and slack. In the Find_VGMC$_{eff}$Cands, $C_n+C_f$ is used as the capacitance for this pruning step. This pruning scheme will cause non-inferior solutions to be pruned. For example, if candidate $\alpha_1$ has $\pi$-model $\pi_1$=(100,0,0,), $\alpha_2$ has $\pi$-model $\pi_2$=(0, 100,101), and both $\alpha_1$ and $\alpha_2$ have the same slack, then $\alpha_2$ will get pruned in favor of $\alpha_1$ because the total capacitance for $\pi_1$(100) is less than r$_2$(101). However, for most drivers, the effective capacitance of $\pi_2$ will be much less than $\pi_1$, because all of the capacitance for $\pi_2$ is strongly shielded, while none of the capacitance for $\pi_1$ is shielded. For this case, $\alpha_1$ is the inferior solution, yet $\alpha_2$ gets pruned.

The algorithm could probably be improved by utilizing a more sophisticated pruning scheme to prevent this type of behavior. For example, one could try calculating an effective capacitance for each $\pi$-model and prune based on that, as opposed to total lumped capacitance. However, effective capacitance is typically computed in the presence of a driver, and repeated expense of this calculation might prove prohibitive. Another alternative might be to prune on the three values ($C_n,R_\pi,C_f$) in each $\pi$-model, as opposed to just one (lumped capacitance). This may lead to too few solutions being pruned, and it is not clear that an efficient pruning scheme can be found.

For an experimental testbed, a small subset of nets was chosen from an IBM ASIC part with over one million transistors, which was designed in a quarter-micron technology. The nets with high total capacitance were selected, since these are likely to be good candidates for buffer insertion. Nets were divided into three groups.

Small: 20 nets with between 2 and 6 sinks were randomly chosen from the set of high capacitance nets.

Medium: 25 nets with between 7 and 15 sinks were randomly chosen from the set of high capacitance nets.

Large: 10 nets with between 18 and 186 sinks that were noted by designers as particularly troublesome for manual buffer insertion.

The aim is to measure the impact of (1) improved gate delay computation; and (2) improved interconnect delay computation. Described below are the results of using four different algorithms on each group of nets using a buffer library consisting of 3 inverting and 13 non-inverting buffers:

VG is Van Ginneken's original algorithm (Elmore delays and simple gate delay modeling);

VGM is VG with moment matching interconnect delay computation;

VGC$_{eff}$ is VG with effective capacitance computations for gate delays; and $VGMC_{eff}$ is VG with both moment matching and effective capacitance delay modeling.

Each algorithm has the capability to trade off solution quality with the total number of buffers. As additional buffers are inserted, the marginal improvement is reduced until the critical number of buffers is reached, at which point adding additional buffers actually leads to worse solutions. For each net and for up to the critical number of buffers, the improvement in critical path delay versus the zero-buffer solution was recorded.

Tables 7, 8 and 9 present the average delay improvement as a function of the number of buffers inserted for each of the four algorithms. The total runtimes are reported for an IBM RS6000/S595 with 1 Gb of RAM in the last line of each table.

TABLE 7

| | | Buffer Insertion Algorithm | | | |
|---|---|---|---|---|---|
| # Buffers | # Nets | VG | VGM | $VGC_{eff}$ | $VGMC_{eff}$ |
| 1 | 20 | 569 | 617 | 548 | 612 |
| 2 | 20 | 709 | 734 | 783 | 794 |
| 3 | 20 | 663 | 716 | 797 | 815 |
| 4 | 19 | 653 | 678 | 831 | 855 |
| 5 | 12 | 726 | 748 | 1001 | 1036 |
| CPU Time | | 223.4 | 245.7 | 235.2 | 244.3 |

Using moment matching (VGM) for the interconnect delay computations yields improvement over VG ranging from 22 to 53 ps for small nets, −2 to 44 ps for medium nets, and −18 to 43 ps for large nets. VGM generally has the most utility for 1 or 2 buffers, with performance declining as the total number of buffers increases. As the number of buffers increases, the interconnect is divided into smaller nets, which reduces the chances of the Elmore delay model being highly inaccurate. The fact VGM sometimes obtains worse results (e.g., the 3 buffer solutions for the large nets group) may be explained by the use of a fixed input transition time of 400 ps for delay computation (when the driver is unknown). A more sophisticated scheme for choosing input slew may be able to improve VGM's performance further.

Using effective capacitance ($VGC_{eff}$) and k-factor equations for the gate delay computations yields improvements over VG of up to 275, 312 and 510 ps for small, medium and large nets, respectively. $VGC_{eff}$ clearly performs better as the number of buffers increases; however, it actually performs worse than VG when 1 buffer is inserted on the set of small and large nets. This may be attributed to two factors. First, a default slew of 400 ps may be too low as an input to the buffer since the load seen at the driver will still be high. Second, the buffer itself will generally be driving a large load, and the k-factor equations may not accurately characterize the buffer for very high capacitances.

TABLE 8

| | | Buffer Insertion Algorithm | | | |
|---|---|---|---|---|---|
| # Buffers | # Nets | VG | VGM | $VGC_{eff}$ | $VGMC_{eff}$ |
| 1 | 25 | 774 | 816 | 778 | 800 |
| 2 | 25 | 1034 | 1066 | 1068 | 1149 |
| 3 | 25 | 1075 | 1119 | 1212 | 1249 |
| 4 | 25 | 1116 | 1114 | 1231 | 1278 |
| 5 | 23 | 1116 | 1114 | 1328 | 1361 |
| 6 | 21 | 937 | 943 | 1249 | 1262 |

TABLE 8-continued

| | | Buffer Insertion Algorithm | | | |
|---|---|---|---|---|---|
| # Buffers | # Nets | VG | VGM | $VGC_{eff}$ | $VGMC_{eff}$ |
| 7 | 15 | 908 | 932 | 1364 | 1372 |
| CPU Time | | 501.0 | 569.3 | 578.2 | 623.2 |

Using both moment matching and effective capacitance ($VGMC_{eff}$) outperforms VG for each set of buffers in each group. Improvements range from 43 to 310 ps for small nets, 26 to 464 ps for medium nets, and 16 to 541 ps for large nets. Further, $VGMC_{eff}$ yields the best result of all four algorithms in every case, except for the one buffer solution in each of the three groups. In these cases, VGM yields larger improvements in delay, which is likely caused by the shortcomings described above of using effective capacitance with one buffer.

The runtime penalties for using improved delay modeling are not prohibitive. For the small and medium nets, $VGMC_{eff}$ uses 9 and 24 percent more CPU time than VG, respectively. For the large nets, $VGMC_{eff}$ takes 3.4 times longer than VG. The increase appears to be fairly evenly distributed between the improved interconnect and gate delay computations.

TABLE 9

| | | Buffer Insertion Algorithm | | | |
|---|---|---|---|---|---|
| # Buffers | # Nets | VG | VGM | $VGC_{eff}$ | $VGMC_{eff}$ |
| 1 | 10 | 1556 | 1605 | 1493 | 1572 |
| 2 | 10 | 1938 | 1946 | 1949 | 1980 |
| 3 | 10 | 2089 | 2071 | 2131 | 2148 |
| 4 | 10 | 2062 | 2057 | 2175 | 2172 |
| 5 | 9 | 2190 | 2177 | 2382 | 2395 |
| 6 | 8 | 2368 | 2360 | 2621 | 2645 |
| 7 | 8 | 2927 | 2930 | 3437 | 3468 |
| CPU Time | | 576.7 | 958.2 | 1058.6 | 1947.2 |

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method implemented in a data processing system for optimizing buffer insertion with accurate gate and interconnect delay computations at a node in a circuit, the method comprising:

selecting a first buffer from a plurality of buffers, each buffer in the plurality of buffers having unique buffer characteristics;

calculating a π-model of a downstream circuit to a child node;

calculating an effective capacitance for the child node using the π-model and the buffer characteristics of the selected first buffer;

calculating a gate delay for the child node using the effective capacitance of the child node;

calculating an interconnect delay for the child node using sets of moments associated with gates downstream from the child node;

calculating slack at the child node for the selected first buffer using the gate delay for the child node and the interconnect delay for the child node;

comparing the slack for the selected buffer with slack for at least one other buffer in the plurality of buffers;

determining an optimal buffer at the child node based on comparing slacks; and inserting the optimal buffer at the child node.

2. The method recited in claim 1 further comprising:

calculating a set of moments associated with a parent node using the sets of moments associated with gates downstream from the child node and the set of moments associated with a wire connected from the child node to the parent node; and calculating slack for the wire at the parent node using the set of moments associated with the parent node.

3. The method recited in claim 2 further comprising:

selecting a second buffer from a plurality of buffers, each buffer in the plurality of buffers having unique buffer characteristics;

calculating a π-model of a downstream circuit to the parent node;

calculating an effective capacitance for the parent node using the π-model and the buffer characteristics of the selected second buffer;

calculating a gate delay for the parent node using the effective capacitance of the parent node;

calculating an interconnect delay for the parent node using sets of moments associated with each gate downstream from the parent node;

calculating slack at the parent node for the selected second buffer using the gate delay for the parent node and the interconnect delay for the parent node;

comparing the slack for the selected second buffer with slack for at least one other buffer in the plurality of buffers; and determining an optimal buffer at the parent node based on comparing slacks.

4. The method recited in claim 1, wherein the π-model comprises at least one non-negative capacitance value.

5. The method recited in claim 1, wherein the π-model is represented by two capacitance values and one resistance value.

6. The method recited in claim 1, wherein each set of moments associated with each gate comprises a set of three moments for each gate, the three moments being the first three moments associated with each gate.

7. The method recited in claim 1, wherein the step of calculating a gate delay for the child node uses a curve-fitted equation.

8. The method recited in claim 1, wherein the child node is one of a sink, a child case, and a two children case.

9. The method recited in claim 1, wherein the child node has a first child and a second child and wherein the π-model is the first π-model, the effective capacitance is the first effective capacitance, the gate delay is the first gate delay, the interconnect delay is the first interconnect delay, the sets of moments are first sets of moments, and the slack is the first slack, the method further comprising:

calculating a second effective capacitance for the child node using a second π-model and the buffer characteristics of the selected buffer;

calculating a second gate delay for the parent node using a second effective capacitance of the child node;

calculating a second interconnect delay for the child node using second sets of moments associated with gates downstream from the child node;

calculating a second slack at the child node for the selected buffer using the second gate delay for the child node and the second interconnect delay for the child node; and comparing the second slack for the second child for the selected buffer with either slack for at least one other buffer in the plurality of buffers or the first slack.

10. The method recited in claim 1 further comprises: storing the calculating π-model for the parent node; storing the slack for the parent node; and storing the set of moments associated with the parent node.

11. A data processing system for optimizing buffer insertion with accurate gate and interconnect delay computations at a node in a circuit, the system comprising:

selecting means for selecting a first buffer from a plurality of buffers, each buffer in the plurality of buffers having unique buffer characteristics;

calculating means for calculating a π-model of a downstream circuit to a child node;

calculating means for calculating an effective capacitance for the child node using the π-model and the buffer characteristics of the selected first buffer;

calculating means for calculating a gate delay for the child node using the effective capacitance of the child node;

calculating means for calculating an interconnect delay for the child node using sets of moments associated with each gate downstream from the child node;

calculating means for calculating slack at the child node for the selected buffer using the gate delay for the child node and the interconnect delay for the child node;

comparing means for comparing the slack for the selected buffer with slack for at least one other buffer in the plurality of buffers;

determining means for determining an optimal buffer at the child node based on comparing slacks; and inserting means for inserting the optimal buffer at the child node.

12. The system recited in claim 11 further comprising:

calculating means for calculating a set of moments associated with a parent node using the sets of moments associated with each gate downstream from the child node and moments associated with a wire from the child node to the parent node; and calculating means for calculating slack for the wire at the parent node using the set of moments associated with the parent node.

13. The system recited in claim 12 further comprising:

selecting means for selecting a second buffer from a plurality of buffers, each buffer in the plurality of buffers having unique buffer characteristics;

calculating means for calculating a π-model of a downstream circuit to the parent node;

calculating means for calculating an effective capacitance for the parent node using the π-model and the buffer characteristics of the selected second buffer;

calculating means for calculating a gate delay for the parent node using the effective capacitance of the parent node;

calculating means for calculating an interconnect delay for the parent node using sets of moments associated with each gate downstream from the parent node;

calculating means for calculating slack at the parent node for the selected buffer using the gate delay for the parent node and the interconnect delay for the parent node;

comparing means for comparing the slack for the selected buffer with slack for at least one other buffer in the plurality of buffers; and determining means for determining an optimal buffer at the parent node based on comparing slacks.

14. The system recited in claim 11, wherein the π-model comprises at least one non-negative capacitance value.

15. The system recited in claim 1, wherein the π-model is represented by two capacitance values and one resistance value.

16. The system recited in claim 11, wherein each set of moments associated with each gate comprises a set of three moments for each gate, the three moments being the first three moments associated with each gate.

17. The system recited in claim 11, wherein the calculating means for calculating a gate delay for the child node uses an implementing means for implementing a curve-fitted equation.

18. The system recited in claim 11, wherein the child node is one of a sink, a child case, and a two children case.

19. The system recited in claim 11, wherein the child node has a first child and a second child and wherein the π-model is the first π-model, the effective capacitance is the first effective capacitance, the gate delay is the first gate delay, the interconnect delay is the first interconnect delay, the sets of moments are first sets of moments, and the slack is the first slack, the method further comprising:

calculating means for calculating a second effective capacitance for the child node using a second π-model and the buffer characteristics of the selected buffer;

calculating means for calculating a second gate delay for the parent node using a second effective capacitance of the child node;

calculating means for calculating a second interconnect delay for the child node using second sets of moments associated with each gate downstream from the child node;

calculating means for calculating a second slack at the child node for the selected buffer using the second gate delay for the child node and the second interconnect delay for the child node; and comparing means for comparing the second slack for the second child for the selected buffer with either slack for at least one other buffer in the plurality of buffers or the first slack.

20. The system recited in claim 11 further comprises:

storing means for storing the π-model for the parent node;

storing means for storing the slack for the parent node; and storing means for storing the set of moments associated with the parent node.

21. A computer program product implemented in a data processing system for optimizing buffer insertion with accurate gate and interconnect delay computations at a node in a circuit, the program embodied on a computer readable medium as a series of instructions, the instructions comprising:

selecting instructions for selecting a buffer from a plurality of buffers, each buffer in the plurality of buffers having unique buffer characteristics;

calculating instructions for calculating a π-model of a downstream circuit to a child node;

calculating instructions for calculating an effective capacitance for the child node using the π-model and the buffer characteristics of the selected buffer;

calculating instructions for calculating a gate delay for the child node using the effective capacitance of the child node;

calculating instructions for calculating an interconnect delay for the child node using sets of moments associated with each gate downstream from the child node;

calculating instructions for calculating slack at the child node for the selected buffer using the gate delay for the child node and the interconnect delay for the child node;

comparing instructions for comparing the slack for the selected buffer with slack for at least one other buffer in the plurality of buffers; and determining instructions for determining an optimal best buffer at the child node based on comparing the slack.

22. A circuit including an optimized buffer, the circuit comprising:

a child node;

a downstream circuit connected to the child node; and a buffer connected to the child node opposite the downstream circuit, wherein the buffer is selected from a plurality of buffers based on effective capacitance for the child node using a π-model of the downstream circuit and the buffer characteristics of the selected buffer, and further based on an interconnect delay for the child node using sets of moments associated with each gate downstream from the child node.

* * * * *